United States Patent
Qian et al.

(10) Patent No.: US 9,586,305 B2
(45) Date of Patent: Mar. 7, 2017

(54) CHEMICAL MECHANICAL POLISHING PAD AND METHOD OF MAKING SAME

(71) Applicants: Rohm and Haas Electronic Materials CMP Holdings, Inc., Newark, DE (US); Dow Global Technologies LLC, Midland, MI (US)

(72) Inventors: Bainian Qian, Newark, DE (US); Julia Kozhukh, Bear, DE (US); Teresa Brugarolas Brufau, Philadelphia, PA (US); David Michael Veneziale, Hatfield, PA (US); Yuhua Tong, Hockessin, DE (US); Diego Lugo, Newark, DE (US); Jeffrey B. Miller, West Chester, PA (US); George C. Jacob, Newark, DE (US); Marty W. DeGroot, Middletown, DE (US); Tony Quan Tran, Bear, DE (US); Marc R. Stack, Middletown, DE (US); Andrew Wank, Avondale, PA (US); Fengji Yeh, Wilmington, DE (US)

(73) Assignees: Rohm and Haas Electronic Materials CMP Holdings, Inc., Newark, DE (US); Dow Global Technologies LLC, Midland, MI (US)

( * ) Notice: Subject to any disclaimer, the term of this patent is extended or adjusted under 35 U.S.C. 154(b) by 0 days.

(21) Appl. No.: 14/751,340

(22) Filed: Jun. 26, 2015

(65) Prior Publication Data
US 2016/0375543 A1    Dec. 29, 2016

(51) Int. Cl.
B24B 37/24    (2012.01)
B24B 53/017    (2012.01)
(Continued)

(52) U.S. Cl.
CPC ............ *B24B 37/24* (2013.01); *B24B 53/017* (2013.01); *B24D 11/001* (2013.01); *B24D 18/00* (2013.01);
(Continued)

(58) Field of Classification Search
None
See application file for complete search history.

(56) References Cited

U.S. PATENT DOCUMENTS

| 4,500,656 A | 2/1985 | Rasshofer et al. |
| 4,980,388 A | 12/1990 | Herrington et al. |

(Continued)

OTHER PUBLICATIONS

Copending U.S. Appl. No. 14/751,350.
(Continued)

*Primary Examiner* — Jiong-Ping Lu
(74) *Attorney, Agent, or Firm* — Thomas S. Deibert; Andrew Merriam

(57) ABSTRACT

A chemical mechanical polishing pad is provided, comprising: a chemical mechanical polishing layer having a polishing surface; wherein the chemical mechanical polishing layer is formed by combining (a) a poly side (P) liquid component, comprising: an amine-carbon dioxide adduct; and, at least one of a polyol, a polyamine and a alcohol amine; and (b) an iso side (I) liquid component, comprising: polyfunctional isocyanate; wherein the chemical mechanical polishing layer has a porosity of ≥10 vol %; wherein the chemical mechanical polishing layer has a Shore D hardness of <40; and, wherein the polishing surface is adapted for polishing a substrate. Methods of making and using the same are also provided.

9 Claims, 9 Drawing Sheets

(51) Int. Cl.
*H01L 21/306* (2006.01)
*G02B 1/12* (2006.01)
*H01F 41/00* (2006.01)
*B24D 18/00* (2006.01)
*B24D 11/00* (2006.01)
*C08J 9/00* (2006.01)
*C08G 18/00* (2006.01)

(52) U.S. Cl.
CPC ............ *C08G 18/00* (2013.01); *C08J 9/0061* (2013.01); *G02B 1/12* (2013.01); *H01F 41/00* (2013.01); *H01L 21/30625* (2013.01); *Y10T 428/249953* (2015.04)

(56) References Cited

U.S. PATENT DOCUMENTS

| | | |
|---|---|---|
| 5,584,146 A | 12/1996 | Shamouillan et al. |
| 5,789,451 A | 8/1998 | Guidetti et al. |
| 5,859,285 A | 1/1999 | Guidetti et al. |
| 6,168,508 B1 | 1/2001 | Nagahara et al. |
| 6,857,941 B2 | 2/2005 | Emami et al. |
| 8,075,372 B2 | 12/2011 | Prasad |
| 8,192,257 B2 | 6/2012 | Chandrasekaran et al. |
| 8,602,851 B2 | 12/2013 | Lombardo et al. |
| 8,715,035 B2 | 5/2014 | Roy et al. |
| 2007/0238297 A1 | 10/2007 | Chandrasekaran et al. |
| 2008/0139684 A1* | 6/2008 | Swisher .................. B24B 37/24 521/155 |
| 2014/0227951 A1 | 8/2014 | Lin et al. |

OTHER PUBLICATIONS

Copending U.S. Appl. No. 14/751,385.
Copending U.S. Appl. No. 14/751,364.
Copending U.S. Appl. No. 14/751,410.
Copending U.S. Appl. No. 14/751,423.
Copending U.S. Appl. No. 14/751,328.

* cited by examiner

CHEMICAL MECHANICAL POLISHING PAD AND METHOD OF MAKING SAME

The present invention relates to a chemical mechanical polishing pad having a polishing layer. More particularly, the present invention relates to a chemical mechanical polishing pad having a chemical mechanical polishing layer having a polishing surface; wherein the chemical mechanical polishing layer is formed by combining (a) a poly side (P) liquid component, comprising: an amine-carbon dioxide adduct; and, at least one of a polyol, a polyamine and a alcohol amine; and (b) an iso side (I) liquid component, comprising: polyfunctional isocyanate; wherein the chemical mechanical polishing layer has a porosity of ≥10 vol %; wherein the chemical mechanical polishing layer has a Shore D hardness of <40; and, wherein the polishing surface is adapted for polishing a substrate; and, to methods of making and using the same.

In the fabrication of integrated circuits and other electronic devices, multiple layers of conducting, semiconducting and dielectric materials are deposited onto and removed from a surface of a semiconductor wafer. Thin layers of conducting, semiconducting and dielectric materials may be deposited using a number of deposition techniques. Common deposition techniques in modern wafer processing include physical vapor deposition (PVD), also known as sputtering, chemical vapor deposition (CVD), plasma-enhanced chemical vapor deposition (PECVD) and electrochemical plating, among others. Common removal techniques include wet and dry isotropic and anisotropic etching, among others.

As layers of materials are sequentially deposited and removed, the uppermost surface of the wafer becomes non-planar. Because subsequent semiconductor processing (e.g., metallization) requires the wafer to have a flat surface, the wafer needs to be planarized. Planarization is useful for removing undesired surface topography and surface defects, such as rough surfaces, agglomerated materials, crystal lattice damage, scratches and contaminated layers or materials.

Chemical mechanical planarization, or chemical mechanical polishing (CMP), is a common technique used to planarize or polish work pieces such as semiconductor wafers. In conventional CMP, a wafer carrier, or polishing head, is mounted on a carrier assembly. The polishing head holds the wafer and positions the wafer in contact with a polishing layer of a polishing pad that is mounted on a table or platen within a CMP apparatus. The carrier assembly provides a controllable pressure between the wafer and polishing pad. Simultaneously, a polishing medium (e.g., slurry) is dispensed onto the polishing pad and is drawn into the gap between the wafer and polishing layer. To effect polishing, the polishing pad and wafer typically rotate relative to one another. As the polishing pad rotates beneath the wafer, the wafer sweeps out a typically annular polishing track, or polishing region, wherein the wafer's surface directly confronts the polishing layer. The wafer surface is polished and made planar by chemical and mechanical action of the polishing layer and polishing medium on the surface.

Hirose et al. disclose a method of making polishing layers in U.S. Pat. No. 8,314,029. Specifically, Hirose et al. disclose a method for manufacturing a polishing pad containing substantially spherical cells and having high thickness accuracy, which includes preparing a cell dispersed urethane composition by a mechanical foaming method; continuously discharging the cell dispersed urethane composition from a single discharge port to a substantially central portion in the width direction of a face material A, while feeding the face material A; laminating a face material B on the cell dispersed urethane composition; then uniformly adjusting the thickness of the cell dispersed urethane composition by thickness adjusting means; curing the cell dispersed urethane composition with the thickness adjusted in the preceding step without applying any additional load to the composition so that a polishing sheet including a polyurethane foam is formed; and cutting the polishing sheet.

Notwithstanding, there is a continuing need for improved chemical mechanical polishing pads containing chemical mechanical polishing layers with improved polishing performance.

The present invention provides a chemical mechanical polishing pad, comprising: a chemical mechanical polishing layer having a polishing surface, a base surface and an average polishing layer thickness, $T_{P-avg}$, measured normal to the polishing surface from the base surface to the polishing surface; wherein the chemical mechanical polishing layer is formed by combining a poly side (P) liquid component and an iso side (I) liquid component; wherein the poly side (P) liquid component comprises an amine-carbon dioxide adduct; and, at least one of a (P) side polyol, a (P) side polyamine and a (P) side alcohol amine; wherein the iso side (I) liquid component, comprising at least one (I) side polyfunctional isocyanate; wherein the chemical mechanical polishing layer has a porosity of ≥10 vol %; wherein the chemical mechanical polishing layer has a Shore D hardness of <40; and, wherein the polishing surface is adapted for polishing a substrate.

The present invention provides a method of making a chemical mechanical polishing layer, comprising: providing a poly side (P) liquid component, comprising an amine-carbon dioxide adduct; and, at least one of a (P) side polyol, a (P) side polyamine and a (P) side alcohol amine; providing a iso side (I) liquid component, comprising at least one at least one (I) side polyfunctional isocyanate; providing a pressurized gas; providing an axial mixing device having an internal cylindrical chamber; wherein the internal cylindrical chamber has a closed end, an open end, an axis of symmetry, at least one (P) side liquid feed port that opens into the internal cylindrical chamber, at least one (I) side liquid feed port that opens into the internal cylindrical chamber, and at least one tangential pressurized gas feed port that opens into the internal cylindrical chamber; wherein the closed end and the open end are perpendicular to the axis of symmetry; wherein the at least one (P) side liquid feed port and the at least one (I) side liquid feed port are arranged along a circumference of the internal cylindrical chamber proximate the closed end; wherein the at least one tangential pressurized gas feed port is arranged along the circumference of the internal cylindrical chamber downstream of the at least one (P) side liquid feed port and the at least one (I) side liquid feed port from the closed end; wherein the poly side (P) liquid component is introduced into the internal cylindrical chamber through the at least one (P) side liquid feed port at a (P) side charge pressure of 6,895 to 27,600 kPa; wherein the iso side (I) liquid component is introduced into the internal cylindrical chamber through the at least one (I) side liquid feed port at an (I) side charge pressure of 6,895 to 27,600 kPa; wherein a combined mass flow rate of the poly side (P) liquid component and the iso side (I) liquid component to the internal cylindrical chamber is 6 to 500 g/s; wherein the poly side (P) liquid component, the iso side (I) liquid component and the pressurized gas are intermixed within the internal cylindrical chamber to form a combination; wherein the pressurized gas is introduced into the internal cylindrical chamber through the at least one tangential pressurized gas feed port with a supply pressure of 150 to 1,500 kPa; wherein an inlet velocity into the internal cylindrical chamber of the pressurized gas is 90 to 600 m/s; discharging the combination from the open end of the internal cylindrical chamber toward a target at a velocity of 10 to 300 msec; allowing the combination to solidify into a cake; and, deriving the chemical mechanical polishing layer from the cake, wherein the chemical mechanical polishing layer has a porosity of ≥10 vol % and a polishing surface adapted for polishing a substrate.

The present invention provides a method of making a chemical mechanical polishing layer, comprising: providing a poly side (P) liquid component, comprising an amine-carbon dioxide adduct; and, at least one of a (P) side polyol, a (P) side polyamine and a (P) side alcohol amine; providing a iso side (I) liquid component, comprising at least one at least one (I) side polyfunctional isocyanate; providing a pressurized gas; providing an axial mixing device having an internal cylindrical chamber; wherein the internal cylindrical chamber has a closed end, an open end, an axis of symmetry, at least one (P) side liquid feed port that opens into the internal cylindrical chamber, at least one (I) side liquid feed port that opens into the internal cylindrical chamber, and at least one tangential pressurized gas feed port that opens into the internal cylindrical chamber; wherein the closed end and the open end are perpendicular to the axis of symmetry; wherein the at least one (P) side liquid feed port and the at least one (I) side liquid feed port are arranged along a circumference of the internal cylindrical chamber proximate the closed end; wherein the at least one tangential pressurized gas feed port is arranged along the circumference of the internal cylindrical chamber downstream of the at least one (P) side liquid feed port and the at least one (I) side liquid feed port from the closed end; wherein the poly side (P) liquid component is introduced into the internal cylindrical chamber through the at least one (P) side liquid feed port at a (P) side charge pressure of 6,895 to 27,600 kPa; wherein the iso side (I) liquid component is introduced into the internal cylindrical chamber through the at least one (I) side liquid feed port at an (I) side charge pressure of 6,895 to 27,600 kPa; wherein a combined mass flow rate of the poly side (P) liquid component and the iso side (I) liquid component to the internal cylindrical chamber is 6 to 500 g/s; wherein the poly side (P) liquid component, the iso side (I) liquid component and the pressurized gas are intermixed within the internal cylindrical chamber to form a combination; wherein the pressurized gas is introduced into the internal cylindrical chamber through the at least one tangential pressurized gas feed port with a supply pressure of 150 to 1,500 kPa; wherein an inlet velocity into the internal cylindrical chamber of the pressurized gas is 90 to 600 m/s; discharging the combination from the open end of the internal cylindrical chamber toward a target at a velocity of 10 to 300 msec; allowing the combination to solidify into a cake; deriving the chemical mechanical polishing layer from the cake; providing a poly side (P) substance, comprising at least one of the (P) side polyol, the (P) side polyamine and the (P) side alcohol amine; providing a iso side (I) substance, comprising at least one (I) side polyfunctional isocyanate; wherein the poly side (P) substance is introduced into the internal cylindrical chamber through the at least one (P) side liquid feed port at the (P) side charge pressure of 6,895 to 27,600 kPa; wherein the iso side (I) substance is introduced into the internal cylindrical chamber through the at least one (I) side liquid feed port at the (I) side charge pressure of 6,895 to 27,600 kPa; wherein a collective mass flow rate of the poly side (P) substance and the iso side (I) substance to the internal cylindrical chamber is 6 to 500 g/s; wherein the poly side (P) substance, the iso side (I) side substance and the pressurized gas are intermixed within the internal cylindrical chamber to form a mixture; wherein the pressurized gas is introduced into the internal cylindrical chamber through the at least one tangential pressurized gas feed port with the supply pressure of 150 to 1,500 kPa; wherein the inlet velocity into the internal cylindrical chamber of the pressurized gas is 90 to 600 m/s; discharging the mixture from the open end of the internal cylindrical chamber toward a base surface of the chemical mechanical polishing layer at a velocity of 10 to 300 msec; allowing the mixture to solidify on the base surface of the chemical mechanical polishing layer to form a subpad; wherein the subpad is integral with the chemical mechanical polishing layer; wherein the subpad has a subpad porosity that is different from that of the chemical mechanical polishing layer; and, wherein the chemical mechanical polishing layer has a porosity of ≥10 vol % and a polishing surface adapted for polishing a substrate.

DETAILED DESCRIPTION

The chemical mechanical polishing pads of the present invention comprise a chemical mechanical polishing layer formed by combining a unique poly side (P) liquid component and an iso side (I) liquid component; wherein the poly side (P) liquid component comprises an amine-carbon dioxide adduct; and, at least one of a (P) side polyol, a (P) side polyamine and a (P) side alcohol amine; wherein the iso side (I) liquid component, comprising at least one (I) side polyfunctional isocyanate. It has been surprisingly found that the incorporation of an amine-carbon dioxide adduct into the soft polishing layer formulations of the present invention provides a significant improvement in substrate polishing performance.

The term "polishing medium" as used herein and in the appended claims encompasses particle-containing polishing solutions and non-particle-containing solutions, such as abrasive-free and reactive-liquid polishing solutions.

Figure 1:
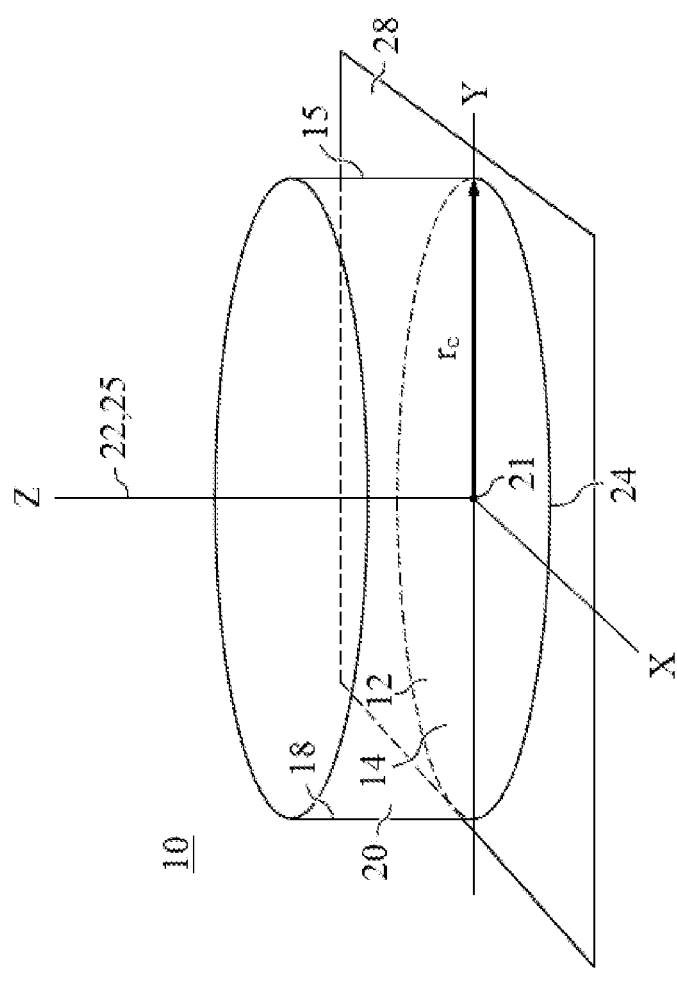
FIG. 1 is a depiction of a perspective view of a mold for use in the method of the present invention.

The term "substantially circular cross section" as used herein and in the appended claims in reference to a mold cavity (20) means that the longest radius, $r_c$, of the mold cavity (20) projected onto the x-y plane (28) from the mold cavity's central axis, $C_{axis}$, (22) to a vertical internal boundary (18) of a surrounding wall (15) is ≤20% longer than the shortest radius, $r_c$, of the mold cavity (20) projected onto the x-y plane (28) from the mold cavity's central axis, $C_{axis}$, (22) to the vertical internal boundary (18). (See FIG. 1).

The term "mold cavity" as used herein and in the appended claims refers to the volume defined by a base (12) and a vertical internal boundary (18) of a surrounding wall (15). (See FIG. 1).

The term "substantially perpendicular" as used herein and in the appended claims in reference to a first feature (e.g., a horizontal internal boundary; a vertical internal boundary) relative to a second feature (e.g., an axis, an x-y plane) means that the first feature is at an angle of 80 to 100° to the second feature.

The term "essentially perpendicular" as used herein and in the appended claims in reference to a first feature (e.g., a horizontal internal boundary; a vertical internal boundary) relative to a second feature (e.g., an axis, an x-y plane) means that the first feature is at an angle of 85 to 95° to the second feature.

Figure 2:
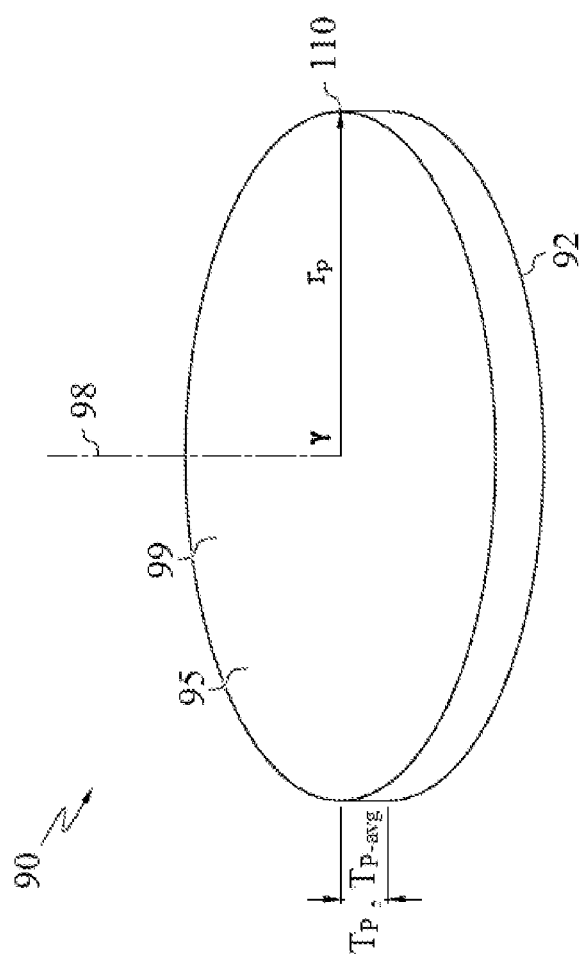
FIG. 2 is a depiction of a perspective view of a chemical mechanical polishing layer of the present invention.

The term "average polishing layer thickness, $T_{P\text{-}avg}$" as used herein and in the appended claims in reference to a chemical mechanical polishing layer (90) having a polishing surface (95) means the average of the polishing layer thickness, $T_P$, of the chemical mechanical polishing layer (90) measured normal to the polishing surface (95) from the polishing surface (95) to the base surface (92) of the chemical mechanical polishing layer (90). (See FIG. 2).

The term "substantially circular cross section" as used herein and in the appended claims in reference to a chemical mechanical polishing layer (90) means that the longest radius, $r_p$, of the cross section from the central axis (98) of the chemical mechanical polishing layer (90) to the outer perimeter (110) of the polishing surface (95) of the chemical mechanical polishing layer (90) is ≤20% longer than the shortest radius, $r_p$, of the cross section from the central axis (98) to the outer perimeter (110) of the polishing surface (95). (See FIG. 2).

The chemical mechanical polishing layer (90) of the present invention is preferably adapted for rotation about a central axis (98). (See FIG. 2). Preferably, the polishing surface (95) of the chemical mechanical polishing layer (90) is in a plane (99) perpendicular to the central axis (98). Preferably, the chemical mechanical polishing layer (90) is adapted for rotation in a plane (99) that is at an angle, γ, of 85 to 95° to the central axis (98), preferably, of 90° to the central axis (98). Preferably, the chemical mechanical polishing layer (90) has a polishing surface (95) that has a substantially circular cross section perpendicular to the central axis (98). Preferably, the radius, $r_p$, of the cross section of the polishing surface (95) perpendicular to the central axis (98) varies by ≤20% for the cross section, more preferably by ≤10% for the cross section.

The term "gel time" as used herein and in the appended claims in reference to a combination of a poly side (P) liquid component and an iso side (I) liquid component formed in an axial mixing device of the present invention, means the total cure time for that combination determined using a standard test method according to ASTM D3795-00a (Reapproved 2006) (*Standard Test Method for Thermal Flow, Cure, and Behavior Properties of Pourable Thermosetting Materials by Torque Rheometer*).

The term "poly(urethane)" as used herein and in the appended claims encompasses (a) polyurethanes formed from the reaction of (i) isocyanates and (ii) polyols (including diols); and, (b) poly(urethane) formed from the reaction of (i) isocyanates with (ii) polyols (including diols) and (iii) water, amines or a combination of water and amines.

Preferably, the chemical mechanical polishing pad method of the present invention, comprises: a chemical mechanical polishing layer (90) having a polishing surface (95), a base surface (92) and an average polishing layer thickness, $T_{P\text{-}avg}$, measured normal to the polishing surface (95) from the base surface (92) to the polishing surface (95); wherein the chemical mechanical polishing layer (90) is formed by combining a poly side (P) liquid component and an iso side (I) liquid component; wherein the poly side (P) liquid component comprises an amine-carbon dioxide adduct; and, at least one of a (P) side polyol, a (P) side polyamine and a (P) side alcohol amine; wherein the iso side (I) liquid component, comprising at least one (I) side polyfunctional isocyanate; wherein the chemical mechanical polishing layer (90) has a porosity of ≥10 vol %; wherein the polishing layer (90) has a Shore D hardness of <40 (preferably, ≤35; more preferably, ≤30; most preferably, ≤25); and, wherein the polishing surface (95) is adapted for polishing a substrate. (See FIG. 2).

Preferably, the poly side (P) liquid component comprises an amine-carbon dioxide adduct; and, at least one of a (P) side polyol, a (P) side polyamine and a (P) side alcohol amine. Preferably, the poly side (P) liquid component contains 0.5 to 7 wt % (preferably, 1 to 5 wt %; more preferably, 2 to 4 wt %) of an amine-carbon dioxide adduct.

Preferably, the amine-carbon dioxide adduct is obtained by contacting carbon dioxide with an alkanolamine, wherein the alkanolamine contains one to two ether moieties per molecule. More preferably, the amine-carbon dioxide adduct is obtained by contacting carbon dioxide with an alkanolamine, wherein the alkanolamine has a formula corresponding to one of the following:

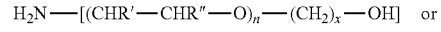
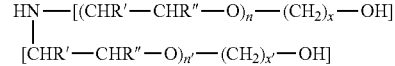

wherein each R' is independently selected from a hydrogen, a methyl group and an ethyl group; wherein each R" is independently selected from a hydrogen, a methyl group and an ethyl group; wherein n is selected from 1 and 2; wherein n' is selected from 1 and 2; wherein n+n'<3; and wherein x is selected from 1, 2, 3 and 4; wherein x' is selected from 1, 2, 3 and 4. Preferably, the amine-carbon dioxide adduct is obtained by contacting carbon dioxide with an alkanolamine, wherein the alkanolamine is a primary amine.

Preferably, the (P) side polyol is selected from the group consisting of diols, polyols, polyol diols, copolymers thereof and mixtures thereof. More preferably, the (P) side polyol is selected from the group consisting of polyether polyols (e.g., poly(oxytetramethylene)glycol, poly(oxypropylene)glycol and mixtures thereof); polycarbonate polyols; polyester polyols; polycaprolactone polyols; mixtures thereof; and, mixtures thereof with one or more low molecular weight polyols selected from the group consisting of ethylene glycol; 1,2-propylene glycol; 1,3-propylene glycol; 1,2- butanediol; 1,3-butanediol; 2-methyl-1,3-propanediol; 1,4-butanediol; neopentyl glycol; 1,5-pentanediol; 3-methyl-1,5-pentanediol; 1,6-hexanediol; diethylene glycol; dipropylene glycol; and, tripropylene glycol. Still more preferably, the at least one (P) side polyol is selected from the group consisting of polytetramethylene ether glycol (PTMEG); ester based polyols (such as ethylene adipates, butylene adipates); polypropylene ether glycols (PPG); polycaprolactone polyols; copolymers thereof; and, mixtures thereof.

Preferably, the poly side (P) liquid component contains at least one (P) side polyol; wherein the at least one (P) side polyol includes a high molecular weight polyol having a number average molecular weight, $M_N$, of 2,500 to 100,000. More preferably, the high molecular weight polyol used has a number average molecular weight, $M_N$, of 5,000 to 50,000 (still more preferably 7,500 to 25,000; most preferably 10,000 to 12,000).

Preferably, the poly side (P) liquid component contains at least one (P) side polyol; wherein the at least one (P) side polyol includes a high molecular weight polyol having an average of three to ten hydroxyl groups per molecule. More preferably, the high molecular weight polyol used has an average of four to eight (still more preferably five to seven; most preferably six) hydroxyl groups per molecule.

Examples of commercially available high molecular weight polyols include Specflex® polyols, Voranol® polyols and Voralux® polyols (available from The Dow Chemical Company); Multranol® Specialty Polyols and Ultracel® Flexible Polyols (available from Bayer MaterialScience LLC); and Pluracol® Polyols (available from BASF). A number of preferred high molecular weight polyols are listed in TABLE 1.

TABLE 1

| High molecular weight polyol | Number of OH groups per molecule | $M_N$ | Hydroxyl Number (mg KOH/g) |
|---|---|---|---|
| Multranol ® 3901 Polyol | 3.0 | 6,000 | 28 |
| Pluracol ® 1385 Polyol | 3.0 | 3,200 | 50 |
| Pluracol ® 380 Polyol | 3.0 | 6,500 | 25 |
| Pluracol ® 1123 Polyol | 3.0 | 7,000 | 24 |
| ULTRACEL ® 3000 Polyol | 4.0 | 7,500 | 30 |
| SPECFLEX ® NC630 Polyol | 4.2 | 7,602 | 31 |
| SPECFLEX ® NC632 Polyol | 4.7 | 8,225 | 32 |
| VORALUX ® HF 505 Polyol | 6.0 | 11,400 | 30 |
| MULTRANOL ® 9185 Polyol | 6.0 | 3,366 | 100 |
| VORANOL ® 4053 Polyol | 6.9 | 12,420 | 31 |

Preferably, the poly side (P) liquid component contains: 0.5 to 7 wt % (more preferably, 1 to 5 wt %; most preferably, 2 to 4 wt %) of the amine-carbon dioxide adduct; and, 25 to 95 wt % of the (P) side polyol; wherein the (P) side polyol is a high molecular weight polyether polyol; wherein the high molecular weight polyether polyol has a number average molecular weight, $M_N$, of 2,500 to 100,000 (more preferably, 5,000 to 50,000; still more preferably, 7,500 to 25,000; most preferably 10,000 to 12,000) and an average of 4 to 8 (more preferably, 5 to 7; most preferably, 6) hydroxyl groups per molecule. Preferably, the poly (P) side polyol is a mixture of a high molecular weight polyether polyol and a low molecular weight polyol; wherein the high molecular weight polyether polyol has a number average molecular weight, $M_N$, of 2,500 to 100,000 (more preferably, 5,000 to 50,000; still more preferably, 7,500 to 25,000; most preferably 10,000 to 12,000) and an average of 4 to 8 (more preferably, 5 to 7; most preferably, 6) hydroxyl groups per molecule; and, wherein the low molecular weight polyol has a number average molecular weight, $M_N$, of ≤200 (more preferably, ≤150; most preferably, ≤100). More preferably, the poly (P) side polyol is a mixture of 70 to 90 wt % of a high molecular weight polyether polyol and 10 to 30 wt % of a low molecular weight polyol; wherein the high molecular weight polyether polyol has a number average molecular weight, $M_N$, of 2,500 to 100,000 (more preferably, 5,000 to 50,000; still more preferably, 7,500 to 25,000; most preferably 10,000 to 12,000) and an average of 4 to 8 (more preferably, 5 to 7; most preferably, 6) hydroxyl groups per molecule; and, wherein the low molecular weight polyol has a number average molecular weight, $M_N$, of ≤200 (more preferably, ≤150; most preferably, ≤100).

Preferably, the (P) side polyamine is selected from the group consisting of diamines and other multifunctional amines. More preferably, the (P) side polyamine is selected from the group consisting of aromatic diamines and other multifunctional aromatic amines; such as, for example, 4,4'-methylene-bis-o-chloroaniline ("MbOCA"); 4,4'-methylene-bis-(3-chloro-2,6-diethylaniline) ("MCDEA"); dimethylthiotoluenediamine; trimethyleneglycol di-p-aminobenzoate; polytetramethyleneoxide di-p-aminobenzoate; polytetramethyleneoxide mono-p-aminobenzoate; polypropyleneoxide di-p-aminobenzoate; polypropyleneoxide mono-p-aminobenzoate; 1,2-bis(2-aminophenylthio)ethane; 4,4'-methylene-bis-aniline; diethyltoluenediamine; 5-tert-butyl-2,4-toluendiamine; 3-tert-butyl-2,6-toluenediamine; 5-tert-amyl-2,4-toluendiamine; and 3-tert-amyl-2,6-toluenediamine and chlorotoluenediamine.

Preferably, the (P) side alcohol amine is selected from the group consisting amine initiated polyols. More preferably, the (P) side alcohol amine is selected from the group consisting amine initiated polyols containing one to four (still more preferably, two to four; most preferably, two) nitrogen atoms per molecule. Preferably, the (P) side alcohol amine is selected from the group consisting amine initiated polyols that have an average of at least three hydroxyl groups per molecule. More preferably, the (P) side alcohol amine is selected from the group consisting of amine initiated polyols that have an average of three to six (still more preferably, three to five; most preferably, four) hydroxyl groups per molecule. Particularly preferred amine initiated polyols a number average molecular weight, $M_N$, of ≤700 (preferably, of 150 to 650; more preferably, of 200 to 500; most preferably 250 to 300) and have a hydroxyl number (as determined by ASTM Test Method D4274-11) of 350 to 1,200 mg KOH/g. More preferably, the amine initiated polyol used has a hydroxyl number of 400 to 1,000 mg KOH/g (most preferably 600 to 850 mg KOH/g). Examples of commercially available amine initiated polyols include the Voranol® family of amine initiated polyols (available from The Dow Chemical Company); the Quadrol® Specialty Polyols (N,N,N',N'-tetrakis(2-hydroxypropyl ethylene diamine))(available from BASF); Pluracol® amine based polyols (available from BASF); Multranol® amine based polyols (available from Bayer MaterialScience LLC); tri-isopropanolamine (TIPA) (available from The Dow Chemical Company); and, triethanolamine (TEA) (available from Mallinckrodt Baker Inc.). A number of preferred amine initiated polyols are listed in TABLE 2.

TABLE 2

| Amine initiated polyol | Number of OH groups per molecule | $M_N$ | Hydroxyl Number (mg KOH/g) |
|---|---|---|---|
| Triethanolamine | 3 | 149 | 1130 |
| Triisopropanolamine | 3 | 192 | 877 |
| MULTRANOL ® 9138 Polyol | 3 | 240 | 700 |
| MULTRANOL ® 9170 Polyol | 3 | 481 | 350 |
| VORANOL ® 391 Polyol | 4 | 568 | 391 |
| VORANOL ® 640 Polyol | 4 | 352 | 638 |
| VORANOL ® 800 Polyol | 4 | 280 | 801 |
| QUADROL ® Polyol | 4 | 292 | 770 |
| MULTRANOL ® 4050 Polyol | 4 | 356 | 630 |
| MULTRANOL ® 4063 Polyol | 4 | 488 | 460 |
| MULTRANOL ® 8114 Polyol | 4 | 568 | 395 |
| MULTRANOL ® 8120 Polyol | 4 | 623 | 360 |
| MULTRANOL ® 9181 Polyol | 4 | 291 | 770 |
| VORANOL ® 202 Polyol | 5 | 590 | 475 |

Preferably, the iso side (I) liquid component, comprises at least one (I) side polyfunctional isocyanate. Preferably, the at least one (I) side polyfunctional isocyanate contains two reactive isocyanate groups (i.e., NCO) per molecule.

Preferably, the at least one (I) side polyfunctional isocyanate is selected from the group consisting of an aliphatic polyfunctional isocyanate, an aromatic polyfunctional isocyanate and a mixture thereof. More preferably, the (I) side polyfunctional isocyanate is a diisocyanate selected from the group consisting of 2,4-toluene diisocyanate; 2,6-toluene diisocyanate; 4,4'-diphenylmethane diisocyanate; naphthalene-1,5-diisocyanate; tolidine diisocyanate; para-phenylene diisocyanate; xylylene diisocyanate; isophorone diisocyanate; hexamethylene diisocyanate; 4,4'-dicyclohexylmethane diisocyanate; cyclohexanediisocyanate; and, mixtures thereof. Still more preferably, the at least one (I) side polyfunctional isocyanate is an isocyanate terminated urethane prepolymer formed by the reaction of a diisocyanate with a prepolymer polyol.

Preferably, the at least one (I) side polyfunctional isocyanate is an isocyanate-terminated urethane prepolymer; wherein the isocyanate-terminated urethane prepolymer has 2 to 12 wt % unreacted isocyanate (NCO) groups. More preferably, the isocyanate-terminated urethane prepolymer used in the method of the present invention has 2 to 10 wt % (still more preferably 4 to 8 wt %; most preferably 5 to 7 wt %) unreacted isocyanate (NCO) groups.

Preferably, the isocyanate terminated urethane prepolymer used is the reaction product of a diisocyanate with a prepolymer polyol; wherein the prepolymer polyol is selected from the group consisting of diols, polyols, polyol diols, copolymers thereof and mixtures thereof. More preferably, the prepolymer polyol is selected from the group consisting of polyether polyols (e.g., poly(oxytetramethylene)glycol, poly(oxypropylene)glycol and mixtures thereof); polycarbonate polyols; polyester polyols; polycaprolactone polyols; mixtures thereof; and, mixtures thereof with one or more low molecular weight polyols selected from the group consisting of ethylene glycol; 1,2-propylene glycol; 1,3-propylene glycol; 1,2-butanediol; 1,3-butanediol; 2-methyl-1,3-propanediol; 1,4-butanediol; neopentyl glycol; 1,5-pentanediol; 3-methyl-1,5-pentanediol; 1,6-hexanediol; diethylene glycol; dipropylene glycol; and, tripropylene glycol. Still more preferably, the prepolymer polyol is selected from the group consisting of polytetramethylene ether glycol (PTMEG); ester based polyols (such as ethylene adipates, butylene adipates); polypropylene ether glycols (PPG); polycaprolactone polyols; copolymers thereof; and, mixtures thereof. Most preferably, the prepolymer polyol is selected from the group consisting of PTMEG and PPG.

Preferably, when the prepolymer polyol is PTMEG, the isocyanate terminated urethane prepolymer has an unreacted isocyanate (NCO) concentration of 2 to 10 wt % (more preferably of 4 to 8 wt %; most preferably 6 to 7 wt %). Examples of commercially available PTMEG based isocyanate terminated urethane prepolymers include Imuthane® prepolymers (available from COIM USA, Inc., such as, PET-80A, PET-85A, PET-90A, PET-93A, PET-95A, PET-60D, PET-70D, PET-75D); Adiprene® prepolymers (available from Chemtura, such as, LF 800A, LF 900A, LF 910A, LF 930A, LF 931A, LF 939A, LF 950A, LF 952A, LF 600D, LF 601D, LF 650D, LF 667, LF 700D, LF750D, LF751D, LF752D, LF753D and L325); Andur® prepolymers (available from Anderson Development Company, such as, 70APLF, 80APLF, 85APLF, 90APLF, 95APLF, 60DPLF, 70APLF, 75APLF).

Preferably, when the prepolymer polyol is PPG, the isocyanate terminated urethane prepolymer has an unreacted isocyanate (NCO) concentration of 3 to 9 wt % (more preferably 4 to 8 wt %, most preferably 5 to 6 wt %). Examples of commercially available PPG based isocyanate terminated urethane prepolymers include Imuthane® prepolymers (available from COIM USA, Inc., such as, PPT-80A, PPT-90A, PPT-95A, PPT-65D, PPT-75D); Adiprene® prepolymers (available from Chemtura, such as, LFG 963A, LFG 964A, LFG 740D); and, Andur® prepolymers (available from Anderson Development Company, such as, 8000APLF, 9500APLF, 6500DPLF, 7501DPLF).

Preferably, the isocyanate terminated urethane prepolymer used in the method of the present invention is a low free isocyanate terminated urethane prepolymer having less than 0.1 wt % free toluene diisocyanate (TDI) monomer content.

Preferably, the iso side (I) liquid component, comprises at least one (I) side polyfunctional isocyanate; wherein the at least one (I) side polyfunctional isocyanate is a non-TDI based isocyanate terminated urethane prepolymer. Non-TDI based isocyanate terminated urethane prepolymers can also be used in the method of the present invention. For example, isocyanate terminated urethane prepolymers include those formed by the reaction of 4,4'-diphenylmethane diisocyanate (MDI) and polyols such as polytetramethylene glycol (PTMEG) with optional diols such as 1,4-butanediol (BDO) are acceptable. When such isocyanate terminated urethane prepolymers are used, the unreacted isocyanate (NCO) concentration is preferably 4 to 10 wt % (more preferably 4 to 8 wt %, most preferably 5 to 7 wt %). Examples of commercially available isocyanate terminated urethane prepolymers in this category include Imuthane® prepolymers (available from COIM USA, Inc. such as 27-85A, 27-90A, 27-95A); Andur® prepolymers (available from Anderson Development Company, such as, IE75AP, IE80AP, IE 85AP, IE90AP, IE95AP, IE98AP); Vibrathane® prepolymers (available from Chemtura, such as, B625, B635, B821); Isonate® modified prepolymer (available from The Dow Chemical Company, such as, Isonate® 240 with 18.7% NCO, Isonate® 181 with 23% NCO, Isonate® 143L with 29.2% NCO); and, polymeric MDI (available from The Dow Chemical Company, such as, PAPI® 20, 27, 94, 95, 580N, 901).

Preferably, at least one of the poly side (P) liquid component and the iso side (I) liquid component can optionally contain additional liquid materials. For example, at least one of the poly side (P) liquid component and the iso side (I) liquid component can contain liquid materials selected from the group consisting of catalysts (e.g., tertiary amine catalysts such as Dabco® 33LV catalyst available from Air Products, Inc.; and tin catalyst such as Fomrez® tin catalyst from Momentive); and surfactants (e.g., Tegostab® silicon surfactant from Evonik). Preferably, the poly side (P) liquid component contains an additional liquid material. More preferably, the poly side (P) liquid component contains an additional liquid material; wherein the additional liquid material is at least one of a catalyst and a surfactant. Most preferably, the poly side (P) liquid component contains a catalyst and a surfactant.

Preferably, the poly side (P) liquid component and the iso side (I) liquid component are provided at a stoichiometric ratio of the reactive hydrogen groups (i.e., the sum of the amine ($NH_2$) groups and the hydroxyl (OH) groups) in the components of the poly side (P) liquid component to the unreacted isocyanate (NCO) groups in the iso side (I) liquid component of 0.85 to 1.15 (more preferably 0.90 to 1.10; most preferably 0.95 to 1.05).

Figure 3:
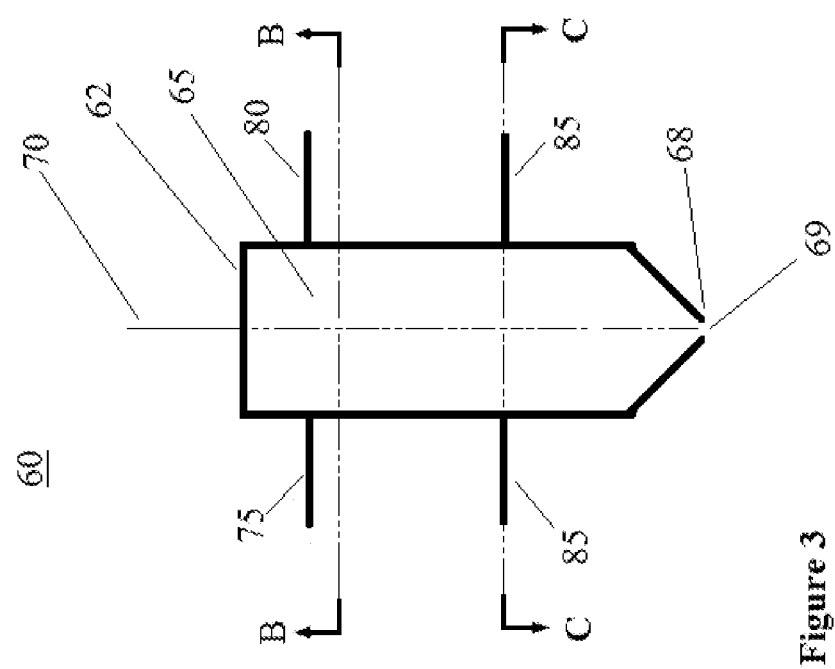
FIG. 3 is a depiction of a side elevational view of an axial mixing device for use in the method of the present invention.
Figure 4:
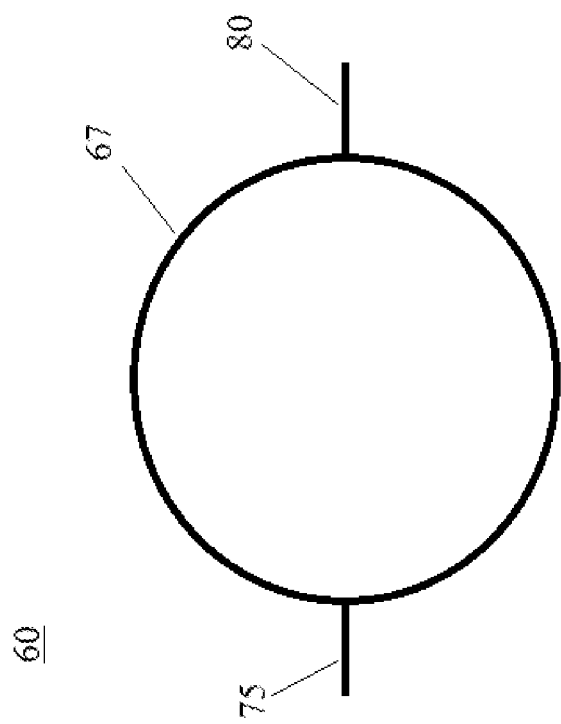
FIG. 4 is a cross sectional view taken along line B-B in FIG. 3.
Figure 5:
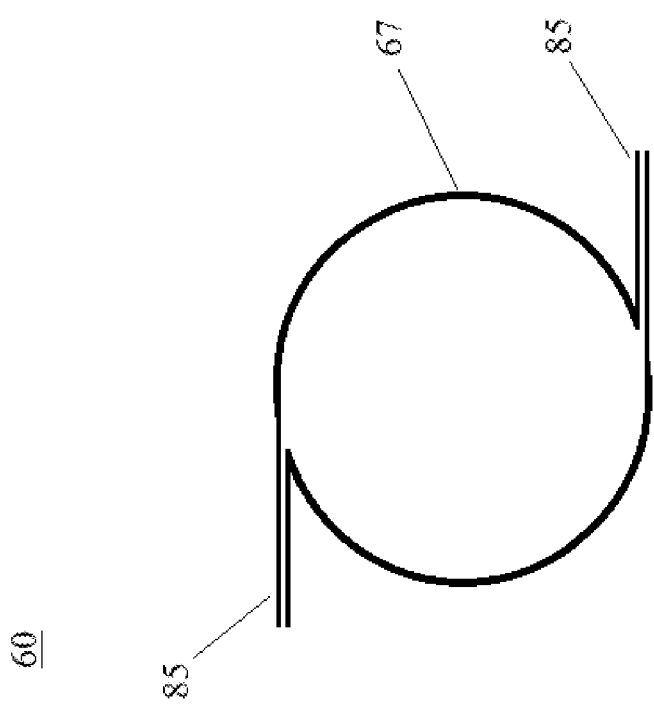
FIG. 5 is a cross sectional view taken along line C-C in FIG. 3.

Preferably, the axial mixing device (60) used in the method of making a chemical mechanical polishing layer of the present invention has an internal cylindrical chamber (65). Preferably, the internal cylindrical chamber (65) has a closed end (62) and an open end (68). Preferably, the closed end (62) and the open end (68) are each substantially perpendicular to an axis of symmetry (70) of the internal cylindrical chamber (65). More preferably, the closed end (62) and the open end (68) are each essentially perpendicular to an axis of symmetry (70) of the internal cylindrical chamber (65). Most preferably, the closed end (62) and the open end (68) are each perpendicular to an axis of symmetry (70) of the internal cylindrical chamber (65). (See FIGS. 3-5).

Preferably, the axial mixing device (60) used in the method of making a chemical mechanical polishing layer of the present invention has an internal cylindrical chamber (65) with an axis of symmetry (70), wherein the open end (68) has a circular opening (69). More preferably, the axial mixing device (60) used in the method of the present invention has an internal cylindrical chamber (65) with an axis of symmetry (70); wherein the open end (68) has a circular opening (69); and, wherein the circular opening (69) is concentric with the internal cylindrical chamber (65). Most preferably, the axial mixing device (60) used in the method of the present invention has an internal cylindrical chamber (65) with an axis of symmetry (70); wherein the open end (68) has a circular opening (69); wherein the circular opening (69) is concentric with the internal cylindrical chamber (65); and, wherein the circular opening (69) is perpendicular to the axis of symmetry (70) of the internal cylindrical chamber (65). Preferably, the circular opening (69) has a diameter of 1 to 10 mm (more preferably, 1.5 to 7.5 mm; still more preferably 2 to 6 mm; most preferably, 2.5 to 3.5 mm). (See FIGS. 3-5).

Preferably, the axial mixing device (60) used in the method of making a chemical mechanical polishing layer the present invention has at least one (P) side liquid feed port (75) that opens into the internal cylindrical chamber (65). More preferably, the axial mixing device (60) used in the method of the present invention has at least two (P) side liquid feed ports (75) that open into the internal cylindrical chamber (65). Preferably, when the axial mixing device (60) used in the method of the present invention has at least two (P) side liquid feed ports (75) that open into the internal cylindrical chamber (65), the at least two (P) side liquid feed ports (75) are arranged evenly about a circumference (67) of the internal cylindrical chamber (65). More preferably, when the axial mixing device (60) used in the method of the present invention has at least two (P) side liquid feed ports (75) that open into the internal cylindrical chamber (65), the at least two (P) side liquid feed ports (75) are arranged evenly about a circumference (67) of the internal cylindrical chamber (65) and are at an equal distance from the closed end (62) of the internal cylindrical chamber (65). Preferably, the at least one (P) side liquid feed port opens into the internal cylindrical chamber (65) through an orifice having an inner diameter of 0.05 to 3 mm (preferably, 0.1 to 0.1 mm; more preferably, 0.15 to 0.5 mm). Preferably, the at least one (P) side liquid feed port opens into the internal cylindrical chamber (65) and is directed toward the axis of symmetry (70) of the internal cylindrical chamber (65). More preferably, the at least one (P) side liquid feed port opens into the internal cylindrical chamber (65) and is directed toward and essentially perpendicular to the axis of symmetry (70) of the internal cylindrical chamber (65). Most preferably, the at least one (P) side liquid feed port opens into the internal cylindrical chamber (65) and is directed toward and perpendicular to the axis of symmetry (70) of the internal cylindrical chamber (65).

Preferably, the axial mixing device (60) used in the method of making a chemical mechanical polishing layer of the present invention has at least one (I) side liquid feed port (80) that opens into the internal cylindrical chamber (65). More preferably, the axial mixing device (60) used in the method of the present invention has at least two (I) side liquid feed ports (80) that open into the internal cylindrical chamber (65). Preferably, when the axial mixing device (60) used in the method of the present invention has at least two (I) side liquid feed ports (80) that open into the internal cylindrical chamber (65), the at least two (I) side liquid feed ports (80) are arranged evenly about a circumference (67) of the internal cylindrical chamber (65). More preferably, when the axial mixing device (60) used in the method of the present invention has at least two (I) side liquid feed ports (80) that open into the internal cylindrical chamber (65), the at least two (I) side liquid feed ports (80) are arranged evenly about a circumference (67) of the internal cylindrical chamber (65) and are at an equal distance from the closed end (62) of the internal cylindrical chamber (65). Preferably, the at least one (I) side liquid feed port opens into the internal cylindrical chamber (65) through an orifice having an inner diameter of 0.05 to 3 mm (preferably, 0.1 to 0.1 mm; more preferably, 0.15 to 0.5 mm). Preferably, the at least one (I) side liquid feed port opens into the internal cylindrical chamber (65) and is directed toward the axis of symmetry (70) of the internal cylindrical chamber (65). More preferably, the at least one (I) side liquid feed port opens into the internal cylindrical chamber (65) and is directed toward and essentially perpendicular to the axis of symmetry (70) of the internal cylindrical chamber (65). Most preferably, the at least one (I) side liquid feed port opens into the internal cylindrical chamber (65) and is directed toward and perpendicular to the axis of symmetry (70) of the internal cylindrical chamber (65).

Preferably, the axial mixing device (60) used in the method of making a chemical mechanical polishing layer of the present invention has at least one (P) side liquid feed port (75) that opens into the internal cylindrical chamber (65) and at least one (I) side liquid feed port (80) that opens into the internal cylindrical chamber (65); wherein the at least one (P) side liquid feed port (75) and the at least one (I) side liquid feed port (80) are arranged evenly about the circumference (67) of the internal cylindrical chamber (65). More preferably, the axial mixing device (60) used in the method of the present invention has at least one (P) side liquid feed port (75) that opens into the internal cylindrical chamber (65) and at least one (I) side liquid feed port (80) that opens into the internal cylindrical chamber (65); wherein the at least one (P) side liquid feed port (75) and the at least one (I) side liquid feed port (80) are arranged evenly about a circumference (67) of the internal cylindrical chamber (65) and are at an equal distance from the closed end (62) of the internal cylindrical chamber (65).

Preferably, the axial mixing device (60) used in the method of making a chemical mechanical polishing layer of the present invention has at least two (P) side liquid feed ports (75) that open into the internal cylindrical chamber (65) and at least two (I) side liquid feed ports (80) that open into the internal cylindrical chamber (65). Preferably, when the axial mixing device (60) used in the method of the present invention has at least two (P) side liquid feed ports (75) that open into the internal cylindrical chamber (65) and at least two (I) side liquid feed ports (80) that open into the internal cylindrical chamber (65), the at least two (P) side liquid feed ports (75) are arranged evenly about the circumference (67) of the internal cylindrical chamber (65) and the at least two (I) side liquid feed ports (80) are arranged evenly about the circumference (67) of the internal cylindrical chamber (65). Preferably, when the axial mixing device (60) used in the method of the present invention has at least two (P) side liquid feed ports (75) that open into the internal cylindrical chamber (65) and at least two (I) side liquid feed ports (80) that open into the internal cylindrical chamber (65), the (P) side liquid feed ports (75) and the (I) side liquid feed ports (80) alternate about the circumference (67) of the internal cylindrical chamber (65). More preferably, when the axial mixing device (60) used in the method of the present invention has at least two (P) side liquid feed ports (75) that open into the internal cylindrical chamber (65) and at least two (I) side liquid feed ports (80) that open into the internal cylindrical chamber (65), the (P) side liquid feed ports (75) and the (I) side liquid feed ports (80) alternate and are evenly spaced about the circumference (67) of the internal cylindrical chamber (65). Most preferably, when the axial mixing device (60) used in the method of the present invention has at least two (P) side liquid feed ports (75) that open into the internal cylindrical chamber (65) and at least two (I) side liquid feed ports (80) that open into the internal cylindrical chamber (65); the (P) side liquid feed ports (75) and the (I) side liquid feed ports (80) alternate and are evenly spaced about the circumference (67) of the internal cylindrical chamber (65); and, the (P) side liquid feed ports (75) and the (I) side liquid feed ports (80) are all at an equal distance from the closed end (62) of the internal cylindrical chamber (65).

Preferably, the axial mixing device (60) used in the method of making a chemical mechanical polishing layer of the present invention has at least one tangential pressurized gas feed port (85) that opens into the internal cylindrical chamber (65). More preferably, the axial mixing device (60) used in the method of the present invention has at least one tangential pressurized gas feed port (85) that opens into the internal cylindrical chamber (65); wherein the at least one tangential pressurized gas feed port (85) is arranged along the circumference of the internal cylindrical chamber (65) downstream of the at least one (P) side liquid feed port (75) and the at least one (I) side liquid feed port (80) from the closed end (62). Still more preferably, the axial mixing device (60) used in the method of the present invention has at least two tangential pressurized gas feed ports (85) that open into the internal cylindrical chamber (65); wherein the at least two tangential pressurized gas feed ports (85) are arranged along the circumference of the internal cylindrical chamber (65) downstream of the at least one (P) side liquid feed port (75) and the at least one (I) side liquid feed port (80) from the closed end (62). Yet still more preferably, the axial mixing device (60) used in the method of the present invention has at least two tangential pressurized gas feed ports (85) that open into the internal cylindrical chamber (65); wherein the at least two tangential pressurized gas feed ports (85) are arranged along the circumference of the internal cylindrical chamber (65) downstream of the at least one (P) side liquid feed port (75) and the at least one (I) side liquid feed port (80) from the closed end (62); and, wherein the at least two tangential pressurized gas feed ports (85) are arranged evenly about a circumference (67) of the internal cylindrical chamber (65). Most preferably, the axial mixing device (60) used in the method of the present invention has at least two tangential pressurized gas feed ports (85) that open into the internal cylindrical chamber (65); wherein the at least two tangential pressurized gas feed ports (85) are arranged along the circumference of the internal cylindrical chamber (65) downstream of the at least one (P) side liquid feed port (75) and the at least one (I) side liquid feed port (80) from the closed end (62); and, wherein the at least two tangential pressurized gas feed ports (85) are arranged evenly about a circumference (67) of the internal cylindrical chamber (65) and are at an equal distance from the closed end (62) of the internal cylindrical chamber (65). Preferably, the at least one tangential pressurized gas feed port opens into the internal cylindrical chamber (65) through an orifice having a critical dimension of 0.1 to 5 mm (preferably, 0.3 to 3 mm; more preferably, 0.5 to 2 mm). Preferably, the at least one tangential pressurized gas feed port opens into the internal cylindrical chamber (65) and is directed tangentially along an internal circumference of the internal cylindrical chamber (65). More preferably, the at least one tangential pressurized gas feed port opens into the internal cylindrical chamber (65) and is directed tangentially along an internal circumference of the internal cylindrical chamber and on a plane that is essentially perpendicular to the axis of symmetry (70) of the internal cylindrical chamber (65). Most preferably, the at least one tangential pressurized gas feed port opens into the internal cylindrical chamber (65) and is directed tangentially along an internal circumference of the internal cylindrical chamber and on a plane that is perpendicular to the axis of symmetry (70) of the internal cylindrical chamber (65).

Preferably, the chemical mechanical polishing pad of the present invention, comprises a chemical mechanical polishing layer having a Shore D hardness of <40 as measured according to ASTM D2240. More preferably, the chemical mechanical polishing pad of the present invention, comprises a chemical mechanical polishing layer having a Shore D hardness of ≤35 (still more preferably, ≤30; most preferably, ≤25) as measured according to ASTM D2240.

Preferably, the chemical mechanical polishing pad of the present invention, comprises a chemical mechanical polishing layer having a porosity of ≥10 vol %. More preferably, the chemical mechanical polishing pad of the present invention, comprises a chemical mechanical polishing layer having a porosity of has a porosity of 25 to 75 vol % (more preferably, 30 to 60 vol %; most preferably, 45 to 55 vol %).

Preferably, the chemical mechanical polishing layer (90) of the present invention has an average polishing layer thickness, $T_{P\text{-}avg}$, of 20 to 150 mils. More preferably the chemical mechanical polishing layer (90) has an average polishing layer thickness, $T_{P\text{-}avg}$, of 30 to 125 mils (still more preferably 40 to 120 mils; most preferably 50 to 100 mils). (See FIG. 2).

Preferably, the chemical mechanical polishing layer of the present invention is adapted for polishing a substrate; wherein the substrate is at least one of a magnetic substrate, an optical substrate and a semiconductor substrate. More preferably, the chemical mechanical polishing layer of the present invention is adapted for polishing a substrate; wherein the substrate is a semiconductor substrate. Most preferably, the chemical mechanical polishing layer of the present invention is adapted for polishing a substrate; wherein the substrate is a semiconductor wafer.

Preferably, the chemical mechanical polishing layer of the present invention has a polishing surface that has at least one of macrotexture and microtexture to facilitate polishing the substrate. Preferably, the polishing surface has macrotexture, wherein the macrotexture is designed to do at least one of (i) alleviate at least one of hydroplaning; (ii) influence polishing medium flow; (iii) modify the stiffness of the polishing layer; (iv) reduce edge effects; and, (v) facilitate the transfer of polishing debris away from the area between the polishing surface and the substrate being polished.

Figure 6:
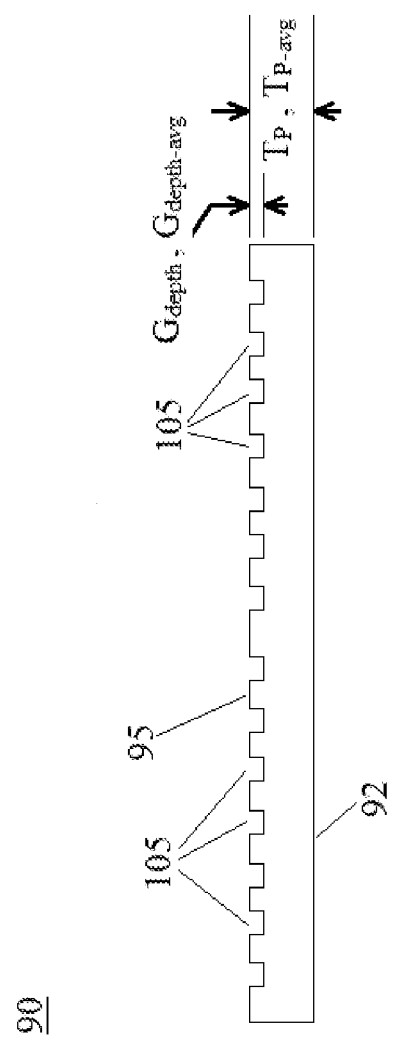
FIG. 6 is a depiction of a side elevational view of a chemical mechanical polishing layer of the present invention.

Preferably, the chemical mechanical polishing layer of the chemical mechanical polishing pad of the present invention has at least one of at least one perforation and at least one groove (105). More preferably, the chemical mechanical polishing layer of the chemical mechanical polishing pad of the present invention has at least one groove (105) formed in the polishing layer (90) opening at the polishing surface (95) and having a groove depth, $G_{depth}$, from the polishing surface (95) measured normal to the polishing surface (95) from the polishing surface (95) toward the base surface (92). Preferably, the at least one groove (105) is arranged on the polishing surface (95) such that upon rotation of the chemical mechanical polishing pad during polishing, the at least one groove (105) sweeps over the substrate. Preferably, the at least one groove is selected from curved grooves, linear grooves and combinations thereof. Preferably, the at least one groove has an average groove depth, $G_{depth\text{-}avg}$, of $\geq 10$ mils (preferably, 10 to 150 mils). Preferably, the at least one groove has an average groove depth, $G_{depth\text{-}avg}$, <the average polishing layer thickness, $T_{P\text{-}avg}$. Preferably, the at least one groove forms a groove pattern that comprises at least two grooves having a combination of an average groove depth, $G_{depth\text{-}avg}$, selected from $\geq 10$ mils, $\geq 15$ mils and 15 to 150 mils; a width selected from $\geq 10$ mils and 10 to 100 mils; and a pitch selected from $\geq 30$ mils, $\geq 50$ mils, 50 to 200 mils, 70 to 200 mils, and 90 to 200 mils. Preferably, the at least one groove is selected from (a) at least two concentric grooves; (b) at least one spiral groove; (c) a cross hatch groove pattern; and (d) a combination thereof. (See FIG. 6).

Preferably, the groove pattern comprises a plurality of grooves. More preferably, the groove pattern is selected from a groove design. Preferably, the groove design is selected from the group consisting of concentric grooves (which may be circular or spiral), curved grooves, cross hatch grooves (e.g., arranged as an X-Y grid across the pad surface), other regular designs (e.g., hexagons, triangles), tire tread type patterns, irregular designs (e.g., fractal patterns), and combinations thereof. More preferably, the groove design is selected from the group consisting of random grooves, concentric grooves, spiral grooves, cross-hatched grooves, X-Y grid grooves, hexagonal grooves, triangular grooves, fractal grooves and combinations thereof. Most preferably, the polishing surface has a spiral groove pattern formed therein. The groove profile is preferably selected from rectangular with straight side walls or the groove cross section may be "V" shaped, "U" shaped, saw-tooth, and combinations thereof.

Preferably, the method of making a chemical mechanical polishing layer of the present invention, comprises: providing a poly side (P) liquid component, comprising an amine-carbon dioxide adduct; and, at least one of a (P) side polyol, a (P) side polyamine and a (P) side alcohol amine; providing a iso side (I) liquid component, comprising at least one at least one (I) side polyfunctional isocyanate; providing a pressurized gas; providing an axial mixing device (60) having an internal cylindrical chamber (65); wherein the internal cylindrical chamber (65) has a closed end (62), an open end (68), an axis of symmetry (70), at least one (P) side liquid feed port (75) that opens into the internal cylindrical chamber (65), at least one (I) side liquid feed port (80) that opens into the internal cylindrical chamber (65), and at least one (preferably, at least two) tangential pressurized gas feed port (85) that opens into the internal cylindrical chamber (65); wherein the closed end (62) and the open end (68) are perpendicular to the axis of symmetry (70); wherein the at least one (P) side liquid feed port (75) and the at least one (I) side liquid feed port (80) are arranged along a circumference (67) of the internal cylindrical chamber (65) proximate the closed end (62); wherein the at least one (preferably, at least two) tangential pressurized gas feed port (85) is arranged along the circumference (67) of the internal cylindrical chamber (65) downstream of the at least one (P) side liquid feed port (75) and the at least one (I) side liquid feed port (80) from the closed end (62); wherein the poly side (P) liquid component is introduced into the internal cylindrical chamber (65) through the at least one (P) side liquid feed port (75) at a (P) side charge pressure of 6,895 to 27,600 kPa; wherein the iso side (I) liquid component is introduced into the internal cylindrical chamber (65) through the at least one (I) side liquid feed port (80) at an (I) side charge pressure of 6,895 to 27,600 kPa; wherein a combined mass flow rate of the poly side (P) liquid component and the iso side (I) liquid component to the internal cylindrical chamber is 6 to 500 g/s (preferably, 6 to 250 g/s; more preferably, 6 to 40 g/s; most preferably, 10 to 25 g/s); wherein the pressurized gas is introduced into the internal cylindrical chamber through the at least one (preferably, at least two) tangential pressurized gas feed port with a supply pressure of 150 to 1,500 kPa; wherein an inlet velocity into the internal cylindrical chamber of the pressurized gas is 90 to 600 m/s; wherein the poly side (P) liquid component, the iso side (I) liquid component and the pressurized gas are intermixed within the internal cylindrical chamber (65) to form a combination; discharging the combination from the open end (68) of the internal cylindrical chamber (65) toward a target at a velocity of 10 to 300 msec; allowing the combination to solidify into a cake; and, deriving the chemical mechanical polishing layer from the cake, wherein the chemical mechanical polishing layer has a porosity of $\geq 10$ vol % and a polishing surface adapted for polishing a substrate (preferably, wherein the chemical mechanical polishing layer has a Shore D hardness of <40 (more preferably, $\leq 35$; more preferably, $\leq 30$; most preferably, $\leq 25$). (See FIGS. 3-5).

Preferably, in the method of making a chemical mechanical polishing layer of the present invention, the poly side (P) liquid component is introduced into the internal cylindrical chamber (65) through the at least one (P) side liquid feed port (75) at a (P) side charge pressure of 6,895 to 27,600 kPa. More preferably, the poly side (P) liquid component is introduced into the internal cylindrical chamber (65) through the at least one (P) side liquid feed port (75) at a (P) side charge pressure of 8,000 to 20,000 kPa. Most preferably, the poly side (P) liquid component is introduced into the internal cylindrical chamber (65) through the at least one (P) side liquid feed port (75) at a (P) side charge pressure of 10,000 to 17,000 kPa.

Preferably, in the method of making a chemical mechanical polishing layer of the present invention, the iso side (I) liquid component is introduced into the internal cylindrical chamber (65) through the at least one (I) side liquid feed port (80) at an (I) side charge pressure of 6,895 to 27,600 kPa. More preferably, the iso side (I) liquid component is introduced into the internal cylindrical chamber (65) through the at least one (I) side liquid feed port (80) at an (I) side charge pressure of 8,000 to 20,000 kPa. Most preferably, the iso side (I) liquid component is introduced into the internal cylindrical chamber (65) through the at least one (I) side liquid feed port (80) at an (I) side charge pressure of 10,000 to 17,000 kPa.

Preferably, in the method of making a chemical mechanical polishing layer of the present invention, the pressurized gas used is selected from the group consisting of carbon dioxide, nitrogen, air and argon. More preferably, the pressurized gas used is selected from the group consisting of carbon dioxide, nitrogen and air. Still more preferably, the pressurized gas used is selected from the group consisting of nitrogen and air. Most preferably, the pressurized gas used is air.

Preferably, in the method of making a chemical mechanical polishing layer of the present invention, the pressurized gas used has a water content of ≤10 ppm. More preferably, the pressurized gas used has a water content of ≤1 ppm. Still more preferably, the pressurized gas used has a water content of ≤0.1 ppm. Most preferably, the pressurized gas used has a water content of ≤0.01 ppm.

Preferably, in the method of making a chemical mechanical polishing layer of the present invention, the pressurized gas is introduced into the internal cylindrical chamber (65) though the at least two tangential pressurized gas feed ports (85) with an inlet velocity, wherein the inlet velocity is 90 to 600 m/s calculated based on ideal gas conditions at 20° C. and 1 atm pressure. Without wishing to be bound by theory, it is noted that when the inlet velocity is too low, the chemical mechanical polishing layer deposited in the mold has an increased likelihood of developing undesirable cracks.

Preferably, in the method of making a chemical mechanical polishing layer of the present invention, the pressurized gas is introduced into the internal cylindrical chamber (65) through the at least two tangential pressurized gas feed ports (85) with a supply pressure of 150 to 1,500 kPa. More preferably, the pressurized gas is introduced into the internal cylindrical chamber (65) through the at least two tangential pressurized gas feed ports (85) with a supply pressure of 350 to 1,000 kPa. Most preferably, the pressurized gas is introduced into the internal cylindrical chamber (65) through the at least two tangential pressurized gas feed ports (85) with a supply pressure of 550 to 830 kPa.

Preferably, in the method of making a chemical mechanical polishing layer of the present invention, the combined mass flow rate of the poly side (P) liquid component and the iso side (I) liquid component to the internal cylindrical chamber (65) is 6 to 500 g/s (preferably, 6 to 250 g/s; more preferably, 6 to 40 g/s; most preferably, 10 to 25 g/s).

Preferably, in the method of making a chemical mechanical polishing layer of the present invention, the ratio of (a) the sum of the combined mass flow rate of the poly side (P) liquid component and the iso side (I) liquid component to the internal cylindrical chamber (65) to (b) the mass flow of the pressurized gas to the internal cylindrical chamber (65) (calculated based on ideal gas conditions at 20° C. and 1 atm pressure) is ≤46 to 1 (more preferably, ≤30 to 1).

Figure 7:
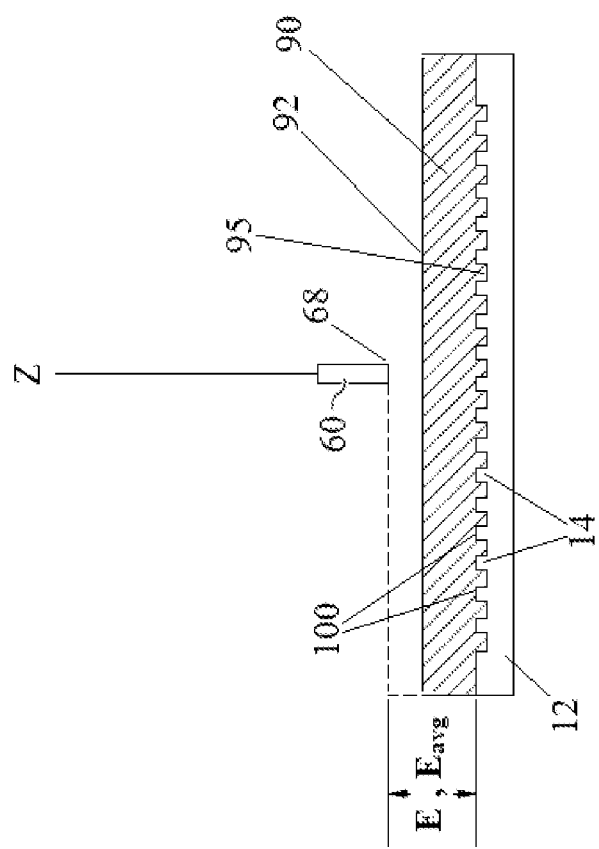
FIG. 7 is a depiction of a side elevational view showing the elevation of an axial mixing device relative to a chemical mechanical polishing layer of the present invention formed on a mold having a negative groove pattern.

Preferably, in the method of making a chemical mechanical polishing layer of the present invention, the combination formed in the axial mixing device (60) is discharged from the open end (68) of the internal cylindrical chamber (65) toward a target (12) at a velocity of 10 to 300 msec. More preferably, the combination is discharged from the opening (69) at the open end (68) of the axial mixing device (60) with a velocity having a z-component in a direction parallel to the z axis (Z) toward a target (12) of 10 to 300 msec. (See FIGS. 1 and 7).

Preferably, in the method of making a chemical mechanical polishing layer of the present invention, the combination is discharged from the open end (68) of the axial mixing device (60) at an elevation, E, along the z dimension above the target (12). More preferably, the combination is discharged from the open end (68) of the axial mixing device (60) at an elevation, E, along the z dimension above the target (12); wherein the average elevation, $E_{avg}$, is 2.5 to 125 cm (more preferably, 7.5 to 75 cm; most preferably, 12.5 to 50 cm). (See FIGS. 1 and 7).

Preferably, in the method of making a chemical mechanical polishing layer of the present invention, the target used is any suitable material for receiving the discharged combination. More preferably, the target is a material selected from a plastic surface, a glass surface and a metal surface. Preferably, the target is selected from flat materials and shaped materials (e.g., a target with a negative groove pattern formed therein).

Preferably, the target (12) used in the method of the present invention defines a negative (14) of a groove pattern; wherein the groove pattern (100) is transferred to the polishing surface (95) of the chemical mechanical polishing layer (90). Preferably, the target (12) has a substantially circular cross section having an average radius, $r_c$, (preferably, wherein $r_c$ is 20 to 100 cm; more preferably, wherein $r_c$ is 25 to 65 cm; most preferably, wherein $r_c$ is 40 to 60 cm). (See FIGS. 1 and 7).

Preferably, the target (12) used in the method of the present invention is an integral part of a mold (10) having a surrounding wall (15). Preferably, the surrounding wall defines a vertical internal boundary (18) of the mold cavity (20) that is substantially perpendicular to the x-y plane (28). More preferably, the surrounding wall defines an vertical internal boundary (18) of the mold cavity (20) that is essentially perpendicular to the x-y plane (28). (See FIG. 1).

Preferably, the mold cavity (20) has a central axis, $C_{axis}$, (22) that coincides with the z-axis and that intersects the horizontal internal boundary (14) of the base (12) of the mold (10) at a center point (21). Preferably, the center point (21) is located at the geometric center of the cross section, $C_{x-sect}$, (24) of the mold cavity (20) projected onto the x-y plane (28). (See FIG. 1).

Preferably, the mold cavity's cross section, $C_{x-sect}$, (24) projected onto the x-y plane (28) can be any regular or irregular two dimensional shape. Preferably, the mold cavity's cross section, $C_{x-sect}$, (24) is selected from a polygon and an ellipse. More preferably, the mold cavity's cross section, $C_{x-sect}$, (24) is a substantially circular cross section having an average radius, $r_c$, (preferably, wherein $r_c$ is 20 to 100 cm; more preferably, wherein $r_c$ is 25 to 65 cm; most preferably, wherein $r_c$ is 40 to 60 cm). Most preferably, the mold cavity (20) approximates a right cylindrically shaped region having a substantially circular cross section, $C_{x\text{-}sect}$; wherein the mold cavity has an axis of symmetry, $C_{x\text{-}sym}$, (25) which coincides with the mold cavity's central axis, $C_{axis}$, (22); wherein the right cylindrically shaped region has a cross sectional area, $C_{x\text{-}area}$, defined as follows:

$$C_{x\text{-}area} = \pi r_c^2,$$

wherein $r_c$ is the average radius of the mold cavity's cross sectional area, $C_{x\text{-}area}$, projected onto the x-y plane (28); and wherein $r_c$ is 20 to 100 cm (more preferably, 25 to 65 cm; most preferably, 40 to 60 cm). (See FIG. 1).

Preferably, in the method of making a chemical mechanical polishing layer of the present invention, the combination formed in the axial mixing device has a gel time of 5 to 900 seconds. More preferably, the combination formed in the axial mixing device has a gel time of 10 to 600 seconds. Most preferably, the combination formed in the axial mixing device has a gel time of 15 to 120 seconds.

Preferably, the chemical mechanical polishing layer prepared using the method of the present invention can be interfaced with at least one additional layer to form a chemical mechanical polishing pad. Preferably, the chemical mechanical polishing layer prepared using the method of the present invention is interfaced with a subpad.

Figure 8:
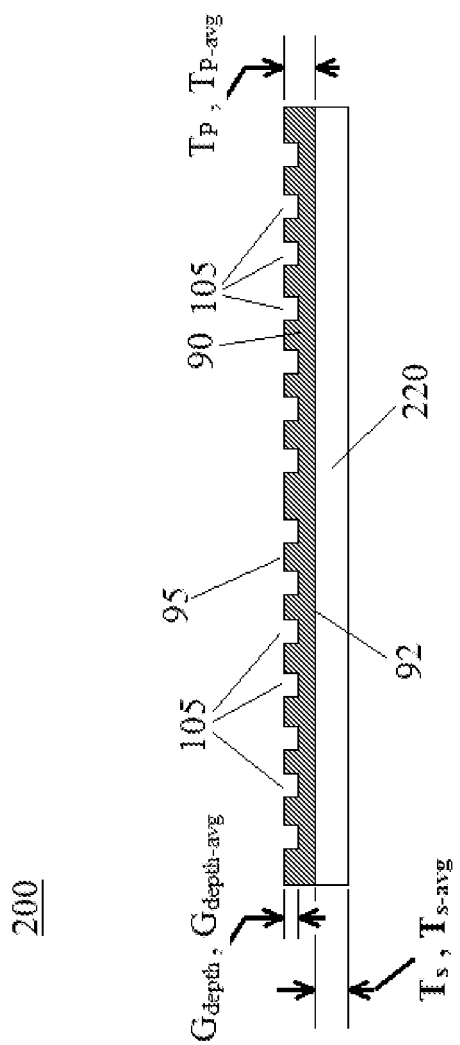
FIG. 8 is depiction of a side elevational view of a cross section of a chemical mechanical polishing pad of the present invention with a subpad that is integral with the chemical mechanical polishing layer.

Preferably, the method of making a chemical mechanical polishing layer (90) for a chemical mechanical polishing pad (200) of the present invention, further comprises: providing a poly side (P) substance, comprising at least one of the (P) side polyol, the (P) side polyamine and the (P) side alcohol amine; providing a iso side (I) substance, comprising at least one (I) side polyfunctional isocyanate; wherein the poly side (P) substance is introduced into the internal cylindrical chamber through the at least one (P) side liquid feed port at the (P) side charge pressure of 6,895 to 27,600 kPa; wherein the iso side (I) substance is introduced into the internal cylindrical chamber through the at least one (I) side liquid feed port at the (I) side charge pressure of 6,895 to 27,600 kPa; wherein a collective mass flow rate of the poly side (P) substance and the iso side (I) substance to the internal cylindrical chamber is 6 to 500 g/s; wherein the poly side (P) substance, the iso side (I) side substance and the pressurized gas are intermixed within the internal cylindrical chamber to form a mixture; wherein the pressurized gas is introduced into the internal cylindrical chamber through the at least one tangential pressurized gas feed port with the supply pressure of 150 to 1,500 kPa; wherein the inlet velocity into the internal cylindrical chamber of the pressurized gas is 90 to 600 m/s; discharging the mixture from the open end of the internal cylindrical chamber toward a base surface of the chemical mechanical polishing layer at a velocity of 10 to 300 msec; allowing the mixture to solidify on the base surface of the chemical mechanical polishing layer to form a subpad (220); wherein the subpad (220) is integral with the chemical mechanical polishing layer (90); wherein the subpad (220) has a subpad porosity that is different from that of the chemical mechanical polishing layer (90). Preferably, the subpad (220) is adjacent to the base surface (92) of the polishing layer (90). Preferably, the subpad (220) has a subpad thickness, $T_s$, normal to the polishing surface (95) of the chemical mechanical polishing layer (90). One of ordinary skill in the art will know to select an appropriate subpad thickness, $T_s$, for the subpad (220). Preferably, the subpad (220) has an average subpad thickness, $T_{S\text{-}avg}$, of ≥15 mils (more preferably, 30 to 100 mils; most preferably 30 to 75 mils). Preferably, the poly side (P) substance and the poly side (P) liquid component can be the same or different. Preferably, the poly side (P) substance and the poly side (P) liquid component are different. Preferably, the poly side (P) substance and the poly side (P) liquid component are the same. The iso side (I) liquid component and the iso side (I) substance can be the same or different. Preferably, the iso side (I) liquid component and the iso side (I) substance are the same. Preferably, the iso side (I) liquid component and the iso side (I) substance are different. (See FIG. 8).

Figure 9:
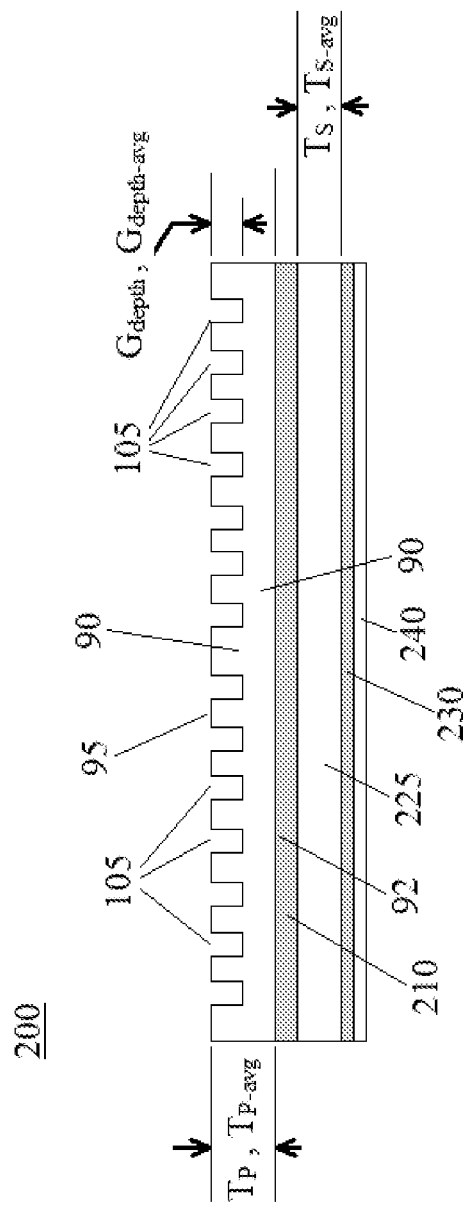
FIG. 9 is a depiction of a side elevational view of a cross section of a chemical mechanical polishing pad of the present invention with a subpad and a platen adhesive.

Preferably, the chemical mechanical polishing layer prepared using the method of the present invention can be interfaced with at least one additional layer (225) (e.g., a subpad) using a stack adhesive (210); wherein the stack adhesive (210) is interposed between the base surface (92) of the chemical mechanical polishing layer (90) and the additional layer (225). The at least one additional layer preferably improves conformance of the chemical mechanical polishing layer to the surface of the substrate being polished. Preferably, the stack adhesive (210) used is an adhesive selected from the group consisting of pressure sensitive adhesives, reactive hot melt adhesives, contact adhesives and combinations thereof. More preferably, the stack adhesive used is selected from the group consisting of reactive hot melt adhesives and pressure sensitive adhesives. Most preferably, the stack adhesive used is a reactive hot melt adhesive. (See FIG. 9).

Preferably, the chemical mechanical polishing pad (200) of the present invention is adapted to be interfaced with the platen of a polishing machine. Preferably, the chemical mechanical polishing pad (200) is adapted to be interfaced with the platen using at least one of a vacuum and a pressure sensitive platen adhesive (230). Preferably, the chemical mechanical polishing pad (200) is adapted to be interfaced with the platen using a pressure sensitive platen adhesive (230). Preferably, when the chemical mechanical polishing pad of the present invention is outfitted with a pressure sensitive platen adhesive (230), the chemical mechanical polishing pad will also have a release layer (240) applied over the pressure sensitive platen adhesive (230). (See, e.g., FIG. 9).

Preferably, the method of polishing a substrate of the present invention, comprises: providing the substrate; wherein the substrate is selected from at least one of a magnetic substrate, an optical substrate and a semiconductor substrate; providing a chemical mechanical polishing pad having a chemical mechanical polishing layer according to the present invention; creating dynamic contact between the polishing surface of the chemical mechanical polishing layer and the substrate to polish a surface of the substrate; and, conditioning of the polishing surface with an abrasive conditioner. More preferably, the method of polishing a substrate of the present invention, comprises: providing the substrate; wherein the substrate is a semiconductor substrate having a TEOS feature; providing a chemical mechanical polishing pad having a chemical mechanical polishing layer according to the present invention; creating dynamic contact between the polishing surface of the chemical mechanical polishing layer and the substrate to polish a surface of the substrate; wherein at least some of the TEOS is removed from the substrate; and, conditioning of the polishing surface with an abrasive conditioner. Still more preferably, the method of polishing a substrate of the present invention, comprises: providing the substrate; wherein the substrate is a semiconductor substrate having a TEOS feature; providing a chemical mechanical polishing pad having a chemical mechanical polishing layer according to the present invention; providing a polishing medium; wherein the polishing medium comprises a colloidal silica abrasive; dispensing the polishing medium onto the polishing surface of the chemical mechanical polishing pad in proximity to an interface between the chemical mechanical polishing pad and the substrate; wherein the polishing medium comes into contact with the TEOS feature and the polishing surface; creating dynamic contact between the polishing surface of the chemical mechanical polishing layer and the substrate to polish a surface of the substrate; wherein at least some of the TEOS is removed from the substrate; and, conditioning of the polishing surface with an abrasive conditioner Some embodiments of the present invention will now be described in detail in the following Examples.

Comparative Example C1

Polishing Layer

A poly side (P) liquid component was provided, containing: 88.62 wt % high molecular weight polyether polyol (Voralux® HF 505 polyol available from The Dow Chemical Company); 10.0 wt % monoethylene glycol; 1.23 wt % of a silicone surfactant (Tegostab® B8418 surfactant available from Evonik); 0.05 wt % of a tin catalyst (Fomrez® UL-28 available from Momentive); and, 0.10 wt % of a tertiary amine catalyst (Dabco® 33LV catalyst available from Air Products, Inc.). An iso side (I) liquid component was provided, containing: 100 wt % of a modified diphenylmethane diisocyanate (Isonate™ 181 MDI prepolymer available from The Dow Chemical Company.) A pressurized gas (dry air) was provided.

An axial mixing device was provided (a MicroLine 45 CSM available from Hennecke GmbH) having a (P) side liquid feed port, an (I) side liquid feed port and four tangential pressurized gas feed ports. The poly side (P) liquid component and the iso side (I) liquid component were fed to the axial mixing device through their respective feed ports with a (P) side charge pressure of 9,500 kPa, an (I) side charge pressure of 11,100 kPa and at a weight ratio of (I)/(P) of 0.71 (giving a stoichiometric ratio of reactive hydrogen groups to NCO groups of 0.95). The pressurized gas was fed through the tangential pressurized gas feed ports with a supply pressure of 830 kPa to give a combined liquid component to gas mass flow rate ratio through the axial mixing device of 4.5 to 1 to form a combination. The combination was discharged from the axial mixing device toward a mold base having a negative of a groove pattern formed therein (a negative K7 type pattern of concentric circular grooves) at a velocity of 254 msec to form a cake on the mold base. The cake was allowed to cure for 16 hours at 100° C. The cake was then allowed to cool to room temperature before separating it from the mold base. The bottom surface of the cake was machined flat on a lathe to provide a polishing layer. The polishing layer was then mated to a Suba IV subpad using a hot melt adhesive to provide a chemical mechanical polishing pad with a chemical mechanical polishing layer having a K7 type groove pattern (concentric circular grooves 20 mil wide; 30 mil deep; 70 mil pitch).

Example 1

Polishing Layer

A poly side (P) liquid component was provided, containing: 88.62 wt % high molecular weight polyether polyol (Voralux® HF 505 polyol available from The Dow Chemical Company); 10.0 wt % monoethylene glycol; 1.23 wt % of a silicone surfactant (Tegostab® B8418 surfactant available from Evonik); 0.05 wt % of a tin catalyst (Fomrez® UL-28 available from Momentive); and, 0.10 wt % of a tertiary amine catalyst (Dabco® 33LV catalyst available from Air Products, Inc.). An additional liquid material (Specflex™ NR 556 $CO_2$/aliphatic amine adduct available from The Dow Chemical Company) was added to the poly side (P) liquid component at 3 parts per 100 parts poly side (P) liquid component by weight. An iso side (I) liquid component was provided, containing: 100 wt % of a modified diphenylmethane diisocyanate (Isonate™ 181 MDI prepolymer available from The Dow Chemical Company.) A pressurized gas (dry air) was provided.

An axial mixing device was provided (a MicroLine 45 CSM available from Hennecke GmbH) having a (P) side liquid feed port, an (I) side liquid feed port and four tangential pressurized gas feed ports. The poly side (P) liquid component and the iso side (I) liquid component were fed to the axial mixing device through their respective feed ports with a (P) side charge pressure of 8,600 kPa, an (I) side charge pressure of 13,100 kPa and at a weight ratio of (I)/(P) of 0.83 (giving a stoichiometric ratio of reactive hydrogen groups to NCO groups of 0.95). The pressurized gas was fed through the tangential pressurized gas feed port with a supply pressure of 830 kPa to give a combined liquid component to gas mass flow rate ratio through the axial mixing device of 4.4 to 1 to form a combination. The combination was discharged from the axial mixing device toward a mold base having a negative of a groove pattern formed therein (a negative K7 type pattern of concentric circular grooves) at a velocity of 254 msec to form a cake on the mold base. The cake was allowed to cure for 16 hours at 100° C. The cake was then allowed to cool to room temperature before separating it from the mold base. The bottom surface of the cake was machined flat on a lathe to provide a polishing layer. The polishing layer was then mated to a Suba IV subpad using a hot melt adhesive to provide a chemical mechanical polishing pad with a chemical mechanical polishing layer having a K7 type groove pattern (concentric circular grooves 20 mil wide; 30 mil deep; 70 mil pitch).

Polishing Layer Properties

The polishing layers from Comparative Example C1 and Example 1 were analyzed to determine their physical properties as reported in TABLE 3. Note that the density data reported were determined according to ASTM D1622; the Shore D hardness data reported were determined according to ASTM D2240; and, the elongation to break data reported were determined according to ASTM D412.

TABLE 3

| Property | Example Ex. C1 | Ex. 1 |
|---|---|---|
| Density (g/cm³) | 0.66 | 0.57 |
| Shore D Hardness, @ 15 s | 29 | 26 |
| porosity (in vol %) | 43 | 50 |
| G' −40° C. (MPa) | 11 | 11 |
| G" −40° C. (MPa) | 1.1 | 1.3 |
| G' −30° C./G' −90° C. | 2.4 | 2.7 |
| Tensile strength (MPa) | 6.2 | 7.3 |
| Elongation to break (%) | 252 | 202 |
| Tensile modulus (MPa) | 15.4 | 28.3 |
| Toughness (MPa) | 11.0 | 10.7 |

Comparative Example PC1 and Example P1

Chemical Mechanical Polishing Removal Rate Experiments

Silicon dioxide removal rate polishing tests were performed using the chemical mechanical polishing pad prepared according to Example 1 and compared with those obtained using the chemical mechanical polishing pad prepared according to Comparative Example C1. Specifically, the silicon dioxide removal rate for each of the polishing pads is provided in TABLE 4. The polishing removal rate experiments were performed on 200 mm blanket S15KTEN TEOS sheet wafers from Novellus Systems, Inc. An Applied Materials 200 mm Mirra® polisher was used. All polishing experiments were performed with a down force of 20.7 kPa (3 psi), a slurry flow rate of 200 ml/min (Klebosol™ 1730 slurry available from Rohm and Haas Electronic Materials CMP Inc.), a table rotation speed of 93 rpm and a carrier rotation speed of 87 rpm. A Saesol 8031C diamond pad conditioner (commercially available from Saesol Diamond Ind. Co., Ltd.) was used to condition the polishing pads. The polishing pads were each broken in with the conditioner using a down force of 31.1 N for 30 minutes. The polishing pads were further conditioned 100% in situ during polishing at 10 sweeps/min from 1.7 to 9.2 in from the center of the polishing pad with a down force of 31.1 N. The removal rates were determined by measuring the film thickness before and after polishing using a KLA-Tencor FX200 metrology tool using a 49 point spiral scan with a 3 mm edge exclusion. Each of the removal rate experiments were performed three times. The average removal rate for the triplicate removal rate experiments for each of the polishing pads is provided in TABLE 4.

TABLE 4

| Ex # | Chemical mechanical polishing pad | TEOS removal rate (Å/min) |
|---|---|---|
| PC1 | Comparative Example C1 | 1596 |
| P1 | Example 1 | 2046 |

We claim:

1. A chemical mechanical polishing pad, comprising:
a chemical mechanical polishing layer having a polishing surface, a base surface and an average polishing layer thickness, $T_{P\text{-}avg}$, measured normal to the polishing surface from the base surface to the polishing surface;
wherein the chemical mechanical polishing layer is formed by combining a poly side (P) liquid component and an iso side (I) liquid component;
wherein the poly side (P) liquid component comprises from 1 to 5 wt. % of an amine carbon dioxide adduct; and from 25 to 95 wt % of a (P) side polyol which is a high molecular weight polyether polyol having a number average molecular weight, $M_N$, of 2,500 to 100,000 and an average of 4 to 8 hydroxyl groups per molecule;
wherein the iso side (I) liquid component, comprising at least one (I) side polyfunctional isocyanate;
wherein the chemical mechanical polishing layer has a porosity of ≥10 vol %;
wherein the chemical mechanical polishing layer has a Shore D hardness of <40; and,
wherein the polishing surface is adapted for polishing a substrate.

2. The chemical mechanical polishing pad of claim 1, wherein the poly side (P) liquid component further comprises: 10 to 30 wt % of a low molecular weight polyol; wherein the low molecular weight polyol has a number average molecular weight, MN, of ≤200.

3. The chemical mechanical polishing pad of claim 1, wherein the (I) side polyfunctional isocyanate has an average of two reactive isocyanate groups per molecule.

4. The chemical mechanical polishing pad of claim 2, wherein the poly side (P) liquid component further comprises: at least one of a catalyst and a surfactant.

5. A method of making a chemical mechanical polishing layer, comprising:
providing a poly side (P) liquid component, comprising from 1 to 5 wt. % of an amine-carbon dioxide adduct; and from 25 to 95 wt % of a (P) side polyol which is a high molecular weight polyether polyol having a number average molecular weight, $M_N$, of 2,500 to 100,000 and an average of 4 to 8 hydroxyl groups per molecule;
providing a iso side (I) liquid component, comprising at least one at least one (I) side polyfunctional isocyanate;
providing a pressurized gas;
providing an axial mixing device having an internal cylindrical chamber;
wherein the internal cylindrical chamber has a closed end, an open end, an axis of symmetry, at least one (P) side liquid feed port that opens into the internal cylindrical chamber, at least one (I) side liquid feed port that opens into the internal cylindrical chamber, and at least one tangential pressurized gas feed port that opens into the internal cylindrical chamber;
wherein the closed end and the open end are perpendicular to the axis of symmetry;
wherein the at least one (P) side liquid feed port and the at least one (I) side liquid feed port are arranged along a circumference of the internal cylindrical chamber proximate the closed end;
wherein the at least one tangential pressurized gas feed port is arranged along the circumference of the internal cylindrical chamber downstream of the at least one (P) side liquid feed port and the at least one (I) side liquid feed port from the closed end;
wherein the poly side (P) liquid component is introduced into the internal cylindrical chamber through the at least one (P) side liquid feed port at a (P) side charge pressure of 6,895 to 27,600 kPa;
wherein the iso side (I) liquid component is introduced into the internal cylindrical chamber through the at least one (I) side liquid feed port at an (I) side charge pressure of 6,895 to 27,600 kPa;
wherein a combined mass flow rate of the poly side (P) liquid component and the iso side (I) liquid component to the internal cylindrical chamber is 6 to 500 g/s;
wherein the poly side (P) liquid component, the iso side (I) liquid component and the pressurized gas are intermixed within the internal cylindrical chamber to form a combination;
wherein the pressurized gas is introduced into the internal cylindrical chamber through the at least one tangential pressurized gas feed port with a supply pressure of 150 to 1,500 kPa;
wherein an inlet velocity into the internal cylindrical chamber of the pressurized gas is 90 to 600 m/s;
discharging the combination from the open end of the internal cylindrical chamber toward a target at a velocity of 10 to 300 m/sec;

allowing the combination to solidify into a cake; and, deriving the chemical mechanical polishing layer from the cake, wherein the chemical mechanical polishing layer has a porosity of ≥10 vol % and a polishing surface adapted for polishing a substrate.

6. The method of claim 5, further comprising:

providing a poly side (P) substance, comprising the (P) side polyol and the (P) side alcohol amine;

providing a iso side (I) substance, comprising at least one (I) side polyfunctional isocyanate;

wherein the poly side (P) substance is introduced into the internal cylindrical chamber through the at least one (P) side liquid feed port at the (P) side charge pressure of 6,895 to 27,600 kPa;

wherein the iso side (I) substance is introduced into the internal cylindrical chamber through the at least one (I) side liquid feed port at the (I) side charge pressure of 6,895 to 27,600 kPa;

wherein a collective mass flow rate of the poly side (P) substance and the iso side (I) substance to the internal cylindrical chamber is 6 to 500 g/s;

wherein the poly side (P) substance, the iso side (I) side substance and the pressurized gas are intermixed within the internal cylindrical chamber to form a mixture;

wherein the pressurized gas is introduced into the internal cylindrical chamber through the at least one tangential pressurized gas feed port with the supply pressure of 150 to 1,500 kPa;

wherein the inlet velocity into the internal cylindrical chamber of the pressurized gas is 90 to 600 m/s;

discharging the mixture from the open end of the internal cylindrical chamber toward a base surface of the chemical mechanical polishing layer at a velocity of 10 to 300 m/sec;

allowing the mixture to solidify on the base surface of the chemical mechanical polishing layer to form a subpad; wherein the subpad is integral with the chemical mechanical polishing layer; wherein the subpad has a subpad porosity that is different from that of the chemical mechanical polishing layer.

7. A method of polishing a substrate, comprising:

providing the substrate; wherein the substrate is selected from at least one of a magnetic substrate, an optical substrate and a semiconductor substrate;

providing a chemical mechanical polishing pad comprising a chemical mechanical polishing layer according to claim 1;

creating dynamic contact between the polishing surface of the chemical mechanical polishing layer and the substrate to polish a surface of the substrate; and, conditioning of the polishing surface with an abrasive conditioner.

8. The method of claim 7, wherein the semiconductor substrate has a tetraethyl orthosilicate (TEOS) feature; and, wherein at least some TEOS is removed from the substrate.

9. The method of claim 8, further comprising:

providing a polishing medium; wherein the polishing medium comprises a colloidal silica abrasive;

dispensing the polishing medium onto the polishing surface of the chemical mechanical polishing pad in proximity to an interface between the chemical mechanical polishing pad and the substrate;

wherein the polishing medium comes into contact with the TEOS feature and the polishing surface.

* * * * *